(12) United States Patent
Hu et al.

(10) Patent No.: US 8,912,044 B2
(45) Date of Patent: Dec. 16, 2014

(54) METHOD FOR BONDING SEMICONDUCTOR SUBSTRATES AND DEVICES OBTAINED THEREOF

(71) Applicants: IMEC, Leuven (BE); Taiwan Semiconductor Manufacturing Company, Ltd., HsinChu (TW)

(72) Inventors: Yu-Hsiang Hu, Heverlee (BE); Chung-Shi Liu, Tervuren (BE)

(73) Assignees: IMEC, Leuven (BE); Taiwan Semiconductor Manufacturing Company, Ltd., HsinChu (TW)

( * ) Notice: Subject to any disclaimer, the term of this patent is extended or adjusted under 35 U.S.C. 154(b) by 0 days.

(21) Appl. No.: 14/094,431

(22) Filed: Dec. 2, 2013

(65) Prior Publication Data

US 2014/0170813 A1 Jun. 19, 2014

(30) Foreign Application Priority Data

Dec. 17, 2012 (EP) .................................... 12197425

(51) Int. Cl.
*H01L 21/00* (2006.01)
*H01L 23/00* (2006.01)

(52) U.S. Cl.
CPC ................ *H01L 24/83* (2013.01); *H01L 24/11* (2013.01); *H01L 24/81* (2013.01); *H01L 2224/81012* (2013.01); *H01L 2224/81948* (2013.01); *H01L 2224/81047* (2013.01); *H01L 24/13* (2013.01); *H01L 24/16* (2013.01); *H01L 2224/05624* (2013.01); *H01L 2224/05644* (2013.01); *H01L 2224/05647* (2013.01);

(Continued)

(58) Field of Classification Search
None
See application file for complete search history.

(56) References Cited

U.S. PATENT DOCUMENTS 6,265,244 B1 7/2001 Hayashi et al.
6,822,336 B2 11/2004 Kurita (Continued)

FOREIGN PATENT DOCUMENTS

JP 2004 281521 10/2004

OTHER PUBLICATIONS

Moriceau et al., "Overview of recent direct wafer bonding advances and applications", Adv. Nat. Sci.: Nanosci. Nanotechnol. 1 (2010) 043004.

(Continued)

*Primary Examiner* — Angel Roman
(74) *Attorney, Agent, or Firm* — Knobbe Martens Olson & Bear, LLP.

(57) ABSTRACT

A method is provided for bonding a first semiconductor substrate to a second semiconductor substrate using low temperature thermo-compression. The bonding method comprises the step of in-situ mechanically scrubbing the metal contact structure surfaces prior to thermo-compression bonding step, thereby planarizing the removing the oxides and/or contaminants from the metal contact structure surfaces. The thermo-compression bonding step is followed by a thermal annealing step for creating interface diffusion between the metal contact structure of the first and second semiconductor substrates

12 Claims, 8 Drawing Sheets

(52) U.S. Cl.
CPC ............... *H01L 2224/11845* (2013.01); *H01L 2224/13009* (2013.01); *H01L 2224/13023* (2013.01); *H01L 2224/13147* (2013.01); *H01L 2224/16146* (2013.01); *H01L 2224/16148* (2013.01); *H01L 2224/73104* (2013.01); *H01L 2224/73204* (2013.01); *H01L 2224/81002* (2013.01); *H01L 2224/81191* (2013.01); *H01L 2224/81193* (2013.01); *H01L 2224/81203* (2013.01); *H01L 2224/8121* (2013.01); *H01L 2224/8183* (2013.01); *H01L 2224/81986* (2013.01); *H01L 2224/83047* (2013.01); *H01L 2224/83191* (2013.01); *H01L 2224/83203* (2013.01); *H01L 2224/83862* (2013.01); *H01L 2224/9221* (2013.01); *H01L 2224/05568* (2013.01); *H01L 2224/11009* (2013.01)
USPC ............ 438/109; 438/106; 438/108; 438/455

(56) References Cited

U.S. PATENT DOCUMENTS

| | | | |
|---|---|---|---|
| 7,973,407 | B2 | 7/2011 | Ramanathan et al. |
| 2003/0001253 | A1 | 1/2003 | Kurita |
| 2003/0001286 | A1 | 1/2003 | Kajiwara et al. |
| 2006/0003548 | A1 | 1/2006 | Kobrinsky et al. |
| 2007/0141750 | A1 | 6/2007 | Iwasaki et al. |
| 2009/0174065 | A1* | 7/2009 | Hayashi et al. ............... 257/712 |
| 2012/0153484 | A1 | 6/2012 | Sadaka |
| 2012/0244665 | A1 | 9/2012 | Sakai et al. |

OTHER PUBLICATIONS

Niklaus et al., "Adhesive wafer bonding", Journal of Applied Physics 99, 031101 (2006).

* cited by examiner

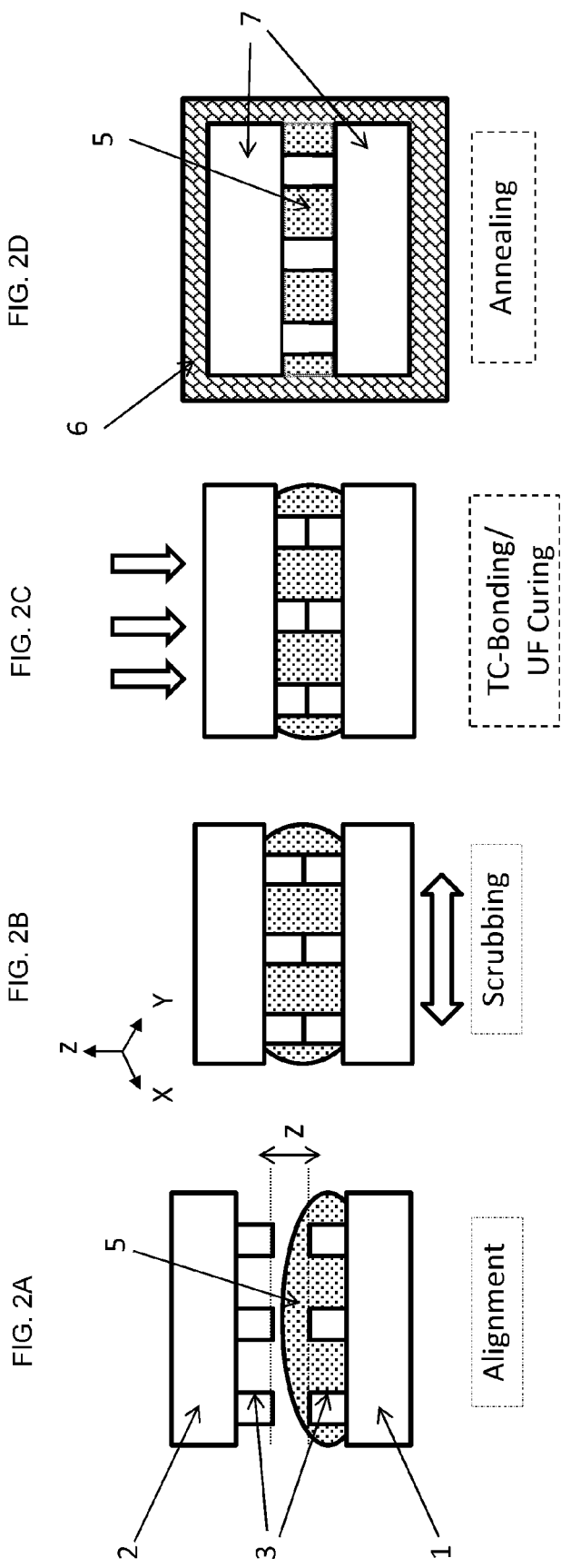

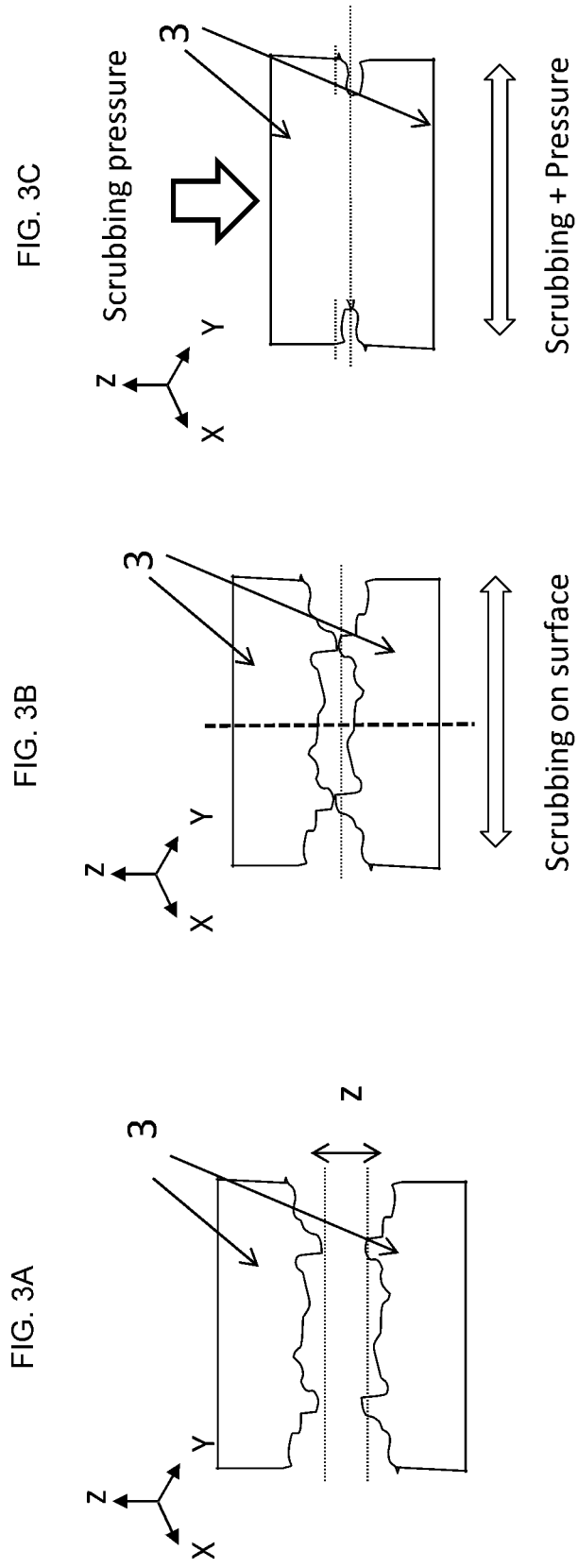

Z=2um, 20sec, 7MPa

Z=1um, 20sec, 7MPa

Z=1um, 5sec, 7MPa

Z=2um, 10sec, 14MPa

Z=2um, 10sec, 7MPa

Z=2um, 10sec, 3.5MPa

Reference Standard

METHOD FOR BONDING SEMICONDUCTOR SUBSTRATES AND DEVICES OBTAINED THEREOF

INCORPORATION BY REFERENCE OF RELATED APPLICATION

Any and all priority claims identified in the Application Data Sheet, or any correction thereto, are hereby incorporated by reference under 37 CFR 1.57. This application claims the benefit of European Patent Application No. 12197425.7, filed Dec. 17, 2012, the disclosure of which is hereby expressly incorporated by reference in its entirety and is hereby expressly made a portion of this application.

FIELD OF THE INVENTION

Methods for three-dimensional stacking of semiconductor substrates and more in particular to a method of bonding semiconductor substrates using thermo-compression are provided.

BACKGROUND

Three-Dimensional (3D) stacking of semiconductor substrates is a promising technology for manufacturing devices with improved performance and power consumption while maintaining a low form factor. Over the past few years, numerous technological advances in the field of 3D technology have been reported. However, reliability and the high cost of manufacturing remain the main issues that prevent 3D technology to be adopted in volume production. These issues are mainly associated with the bonding of semiconductor substrates and more specifically with the material selection and bonding methods used therein.

One of the most attractive volume production methods for bonding semiconductor substrates is the Copper to Copper bonding, hereinafter referred to as Cu—Cu bonding. Copper is favored by the semiconductor industry over other metals, e.g., Al, Au, because of its superior electrical conductivity characteristic and low cost, when used in large volume manufacturing. On the other hand, Cu has a tendency to develop oxides and other contaminants during manufacturing. Therefore, in order to achieve a successful bond between the semiconductor substrates, the oxides and contaminants formed on the Cu surface need to be removed. In principle, Cu—Cu bonding is achieved through thermo-compression, hereinafter referred to as TC-bonding, whereby the Cu surfaces of the semiconductor substrates are brought into contact applying force (pressure) and heat simultaneously. In order to break through the oxides and contaminants formed on the Cu surfaces, TC-bonding typically requires a temperature of around 300 to 450° C. coupled with a pressure exceeding 300 MPa for duration of around 20 to 60 min. As a result of the high temperature and high pressure applied during TC-bonding, stress related failures might occur in the bonded semiconductor substrates, thereby compromising reliability and hence yield of the 3D device manufactured. Moreover, the conditions for performing TC-bonding, limit the applications that could benefit from Cu—Cu bonding. As an example, a memory chip containing DRAM or SRAM cells will not be able to withstand the temperature and forces applied during thermo-compression bonding.

In the context of TC-bonding, U.S. Pat. No. 7,973,407 describes a number of 3D stacked substrate arrangements and methods for minimizing or preventing Cu oxidization, thereby enabling low temperature and low pressure TC-bonding. More specifically, the process flows described therein minimize or prevent Cu oxidization by quickly bonding the semiconductor substrates after a chemical cleaning step has been performed, thereby reducing the time that the Cu surface is exposed to the atmosphere and thereby minimizing Cu oxidization. The proposed process flows are carried out in a controlled process environment and requires complex processing steps, for example the chemical cleaning step, that are incompatible with current high volume semiconductor manufacturing processes. As a result, overall cost of manufacturing is increased while throughput is reduced.

SUMMARY OF THE INVENTION

Certain of the embodiments relate to a method for bonding semiconductor substrates at low temperature and low pressure using thermo-compression (TC) bonding.

This is achieved by removing oxides and other contaminants from the surfaces of the metal contact structures formed on the surface of the semiconductor substrates. This removal step is performed prior to TC-bonding and as a result the temperature and pressure required for achieving an effective bond between the semiconductor substrates is reduced.

In certain embodiments, the metal contact structures formed on the surface of the semiconductor substrates may comprise materials such as Cu, Al or Au. More preferably the metal surfaces comprise Cu due to its low cost and electrical characteristics.

By reducing the temperature and pressure required during TC-bonding, stress related failures of the bonded substrates are significantly reduced. As a result, TC-bonding method can be applied in applications with stringent requirements, such as in the bonding of memory Integrated Circuits (IC).

The removal of the oxides and contaminants from the metal surfaces involves an in-situ mechanical scrubbing action, preferably performed by the bonder tool that is subsequently used in TC-bonding. During this step the metal contact structures of the semiconductor substrates are placed in close proximity and with their surfaces in physical contact. Mechanical scrubbing provides a soft friction action, which is achieved by controlling the X and Y plane movement of the semiconductor substrates. By controlling the X and Y plane of the semiconductor substrates a circular movement is created. The mechanical scrubbing action is performed at very low frequency, while the X-Y plane movement of the semiconductor substrates ranges from a few nanometers to around a few micrometer, more preferably the X-Y plane movement is around 1 um In certain embodiments, the metal contact structures formed on the surface of the semiconductor substrates can be any of micro-bumps, exposed Through Silicon Via (TSV) nails, or contact landing pad. It is preferred that the metal contact structures of at least one of the semiconductor substrates to be bonded protrude from the surface in which they are formed. Although, bonding of metal contact structures having a homogeneous configuration is proffered, for example micro-bump to micro-bump bonding, this is not a limitation any combination of the previously mentioned contact structures can equally be realized.

The mechanical-scrubbing is performed for predetermined time duration. This time duration may vary depending on the properties of the material used for the metal contact structures (Cu, Al, Au, and the like) and the amount of oxide and/or contaminants to be removed from the metal surfaces of said metal contact structures. For example, a metal contact structure comprising Cu may require a different mechanical scrubbing time duration to the one required. It is preferred, that mechanical scrubbing is performed for a time duration between 5 seconds to 40 seconds.

An advantage of the mechanical scrubbing step over other methods for the removal of oxides and contaminants from the metal contact structures, is that it is compatible with current high volume semiconductor manufacturing processes. Furthermore, the mechanical scrubbing step can be performed at a location which is independent from the manufacturing of the semiconductor substrates. This is a major advantage, especially in the case whereby semiconductor substrates from different manufacturer are bonded in a third party location, such a packaging house.

In certain embodiments, a low pressure force can be applied during the mechanical scrubbing step. By applying a low pressure force during mechanical scrubbing the time duration for which scrubbing is performed can be reduced. This is highly beneficial in the case wherein a substantial layer of oxide and/or contaminants has been formed on the metal surfaces. The pressure applied during this step is preferably between 3.5 MPa and 14 MPa.

Applying a pressure during the mechanical scrubbing step has the additional advantage of improving the roughness of the metal surfaces. As a result, a planarization of the metal surfaces is achieved. The planarization of metal surfaces has been found to contribute significantly in lowering the temperature and pressure applied during TC-bonding and improving reliability. Therefore it is desirable to provide the contact structures with substantially planar metal surfaces.

It is further desirable to combine the mechanical scrubbing method with conventional techniques for further improving the planarization of the surfaces of the metal contact structures, for example Chemical Mechanical Polishing (CMP), or fly cutting process using a single-crystalline diamond turning tool. These techniques are traditionally performed prior to the TC-bonding for the same purpose; however, their effectiveness is limited at planarizing surfaces at a micro/nano level and for removing substantially thicker oxide and/or contaminant layers. In the planarization of metal surfaces the use of fly cutting is preferred over the CMP, due to its speed of operation and less abrasive nature.

It has been found, that the combination of fly-cutting and mechanical scrubbing can significantly further reduce the temperature, pressure and time required during bonding. Therefore, by introducing the step of mechanical scrubbing TC-bonding can be performed at the following conditions: at a temperature between 150° C. and 300° C., and more preferably at around 220° C., at a pressure between 10 MPa and 300 MPa, and more preferably at 20 MPa, and for a duration between around 1 second and 5 minutes, and more preferably 45 seconds.

In certain embodiments, an "underfill" material may be deposited on the surface of the semiconductor substrate(s) prior to TC-bonding. The "underfill" material is an adhesive and has non-conductive properties that "locks together" the semiconductor substrates and compensates for differences in thermal expansion. The selection of the 'underfill" material is closely related to the TC-bonding conditions. Therefore, for high temperature and high pressure TC-bonding a suitable "underfill" material needs to be selected. However, high temperature curing "underfill" materials may exhibit additional thermal budget and stress due to Coefficient of Thermal Expansion (CTE) mismatch during bonding, which might cause reliability concerns for certain application, such as memory.

By reducing the temperature and pressure required during TC-bonding using the method disclosed herein, "underfill" materials with lower curing temperature can be selected. Therefore, the thermal budget and stress related reliability failures are minimized.

After TC-bonding the metal surfaces of the contact structures in the resulting semiconductor substrate stack are physically connected and have an electrical yield. However, interface diffusion of the metal atoms between the contact structures is not present. This interface diffusion of the metal atoms is achieved by subjecting the semiconductor stack to a post-bonding thermal annealing step. During this step the semiconductor substrate stack is placed in an oven, whereby the semiconductor stack is baked for a predefined duration at a constant temperature.

It has been found that for metal contact structures comprising Cu, interface diffusion can be achieved at a temperature between 150° C. to 300° C. for a time duration (period) between 30 minutes to around 60 minutes.

The method disclosed herein is independent of the dimensions of the contact structures and can equally be applied for semiconductor substrates having contact structures with substantially identical (symmetric) dimensions or substantially different (asymmetric) dimensions.

BRIEF DESCRIPTION OF THE DRAWINGS

For a better understanding of the disclosure, reference will now be made, by way of example only, to the accompanying drawings in which:

FIGS. 2A-2D presents a processing flow for bonding semiconductor substrates in accordance with certain embodiments.

FIGS. 3A-3C show the mechanical scrubbing method process steps according to one embodiment.

DETAILED DESCRIPTION OF ILLUSTRATIVE EMBODIMENTS

Figure 1A:
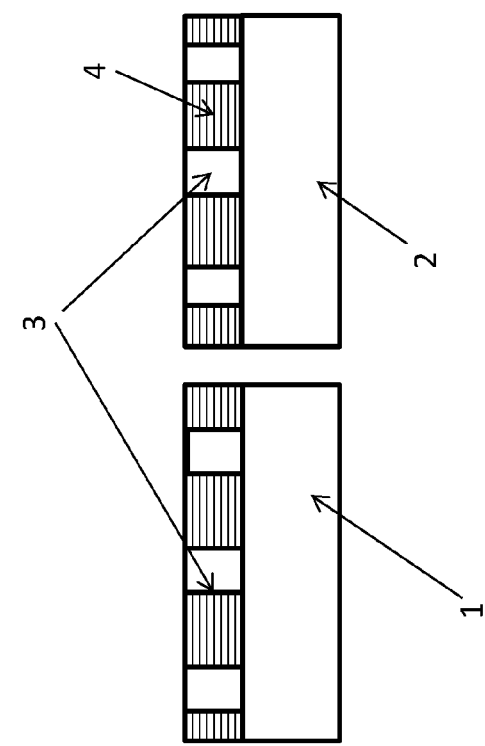
FIGS. 1A-1C show an exemplary process flow for performing planarization of the Cu micro-bump surfaces using fly cutting method.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes.

Moreover, the term top and the like in the description and the claims are used for descriptive purposes and not necessarily for describing relative positions. It is to be understood that the terms so used are interchangeable under appropriate circumstances and that the preferred embodiments described herein are capable of operation in other orientations than described or illustrated herein.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary preferred embodiments, various features of the disclosure are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed disclosure requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that preferred embodiments may be practiced without these specific details. In other instances, well-known methods, structures and techniques have not been shown in detail in order not to obscure an understanding of this description.

The present disclosure will now be described by a detailed description of several preferred embodiments. It is clear that other preferred embodiments can be configured according to the knowledge of persons skilled in the art without departing from the true spirit or technical teaching of the disclosure as defined by the appended claims.

Although the present disclosure is described with references to the bonding of a first and a second semiconductor substrate each comprising at least one Cu micro-bump, it is to be understood that the present disclosure is not limited to the type of contact structures and number of semiconductor substrates to be stacked in a Three-Dimensional (3D) configuration. For example, the present disclosure can be extended to the bonding of more than two semiconductor substrates and/or to semiconductor substrates comprising contact structures such as micro-bumps, exposed Through Silicon Via (TSV) nails, or contact landing pads. In addition Cu as a metal of choice for the metal contact structure can be replaced by other of metals such as Al, Au, or Sn.

Figure 1B:
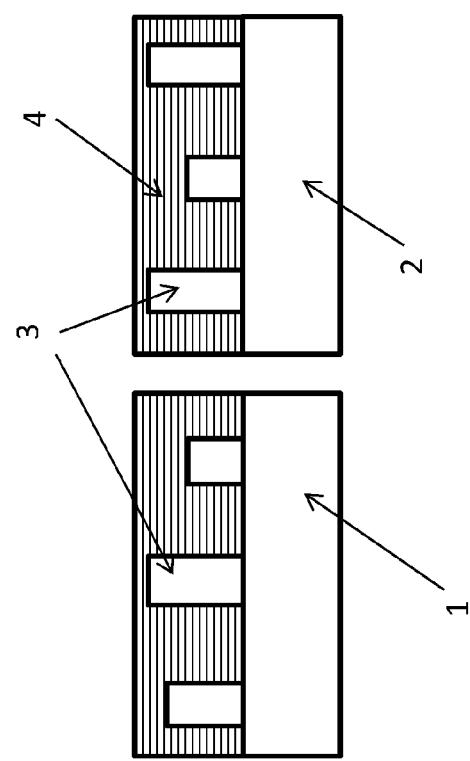
Figure 1C:
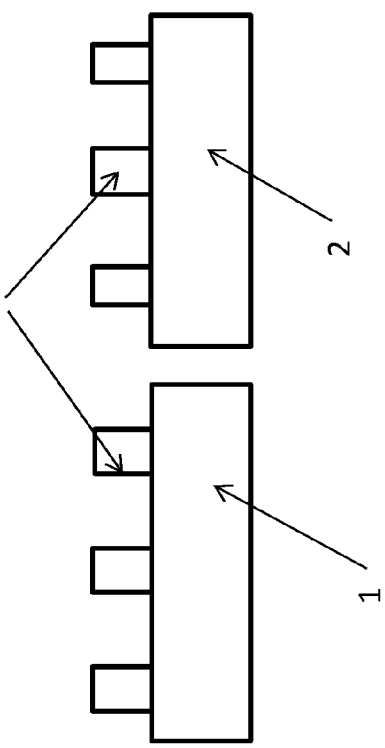

According to certain embodiments, Thermo-compression (TC) bonding of at least two semiconductor substrates comprising Cu micro-bumps is performed in two stages, namely substrate planarization followed by substrate bonding In the first stage the semiconductor substrates undergo a number of process steps for preparing the surfaces of the Cu micro-bumps for bonding. FIGS. 1A to 1C describes a series of processing steps for performing planarization of semiconductor substrates using fly cutting. In FIG. 1A the first semiconductor substrate 1 and second semiconductor substrate 2 are provided with Cu micro-bumps 3 formed on a main surface of the first and second semiconductor substrates 1 and 2. A resist 4 is deposited to protect the Cu micro-bumps from oxidization thereof and from deposition of contaminants on the metal surfaces of the Cu micro-bumps 3 during planarization. In FIG. 1B the planarization of the Cu micro-bumps is performed using the fly cutting method, thereby providing Cu micro-bumps 3 with a substantially planar surface and substantially equal height thereby correcting any topography irregularities on the first and second semiconductor substrates 1 and 2. Once planarization of the Cu micro-bumps 3 is performed, the resist 4 is removed and the first and second semiconductor substrates 1 and 2 are ready for bonding, as shown in FIG. 1C. Planarization of the surfaces of the Cu micro-bump 3 can be carried out by other state-of-the-art technique such as Chemical Mechanical polishing (CMP). However, fly cutting process using a single-crystalline diamond turning tool is preferred as it is less abrasive on the semiconductor substrates and can be performed in a single step.

Once the planarization stage has been completed the first and second semiconductor substrates 1 and 2 are ready to be assembled following the processing steps shown in FIGS. 2A-2D.

During the assembly stage the first and second semiconductor substrates 1 and 2 are positioned in a 3D stack configuration, thereby aligning the Cu micro-bumps 3 of the first and second semiconductor substrates 1 and 2 such that these Cu micro-bumps 3 face each-other, as shown in FIG. 2A. At this step the second semiconductor substrate 2 is suspended above the first semiconductor substrate 1 with the help of the bonder tool. The resulting distance between the surfaces of the Cu micro-bumps is around 1 um to 5 um, and more preferably 2 um. Prior to this step, an 'underfill" material 5 can be optionally deposited on the main surface of the semiconductor substrate 1 on which the Cu micro bumps 3 are present. The "underfill" material 5 is a non-conductive material that is mainly used to prevent corrosion of the Cu micro-bumps 3 and is extensively used in the packaging industry. In addition, "underfill" material 5 due to its adhesive properties provides extra mechanical strength to the resulting bonded semiconductor substrate stack. It has been found that the use of the "underfill" material 5 in 3D technology has the advantage of compensating for any thermal expansion difference between the semiconductor substrates 1 and 2 thereby preventing stress related failures and improving reliability.

Figure 4:
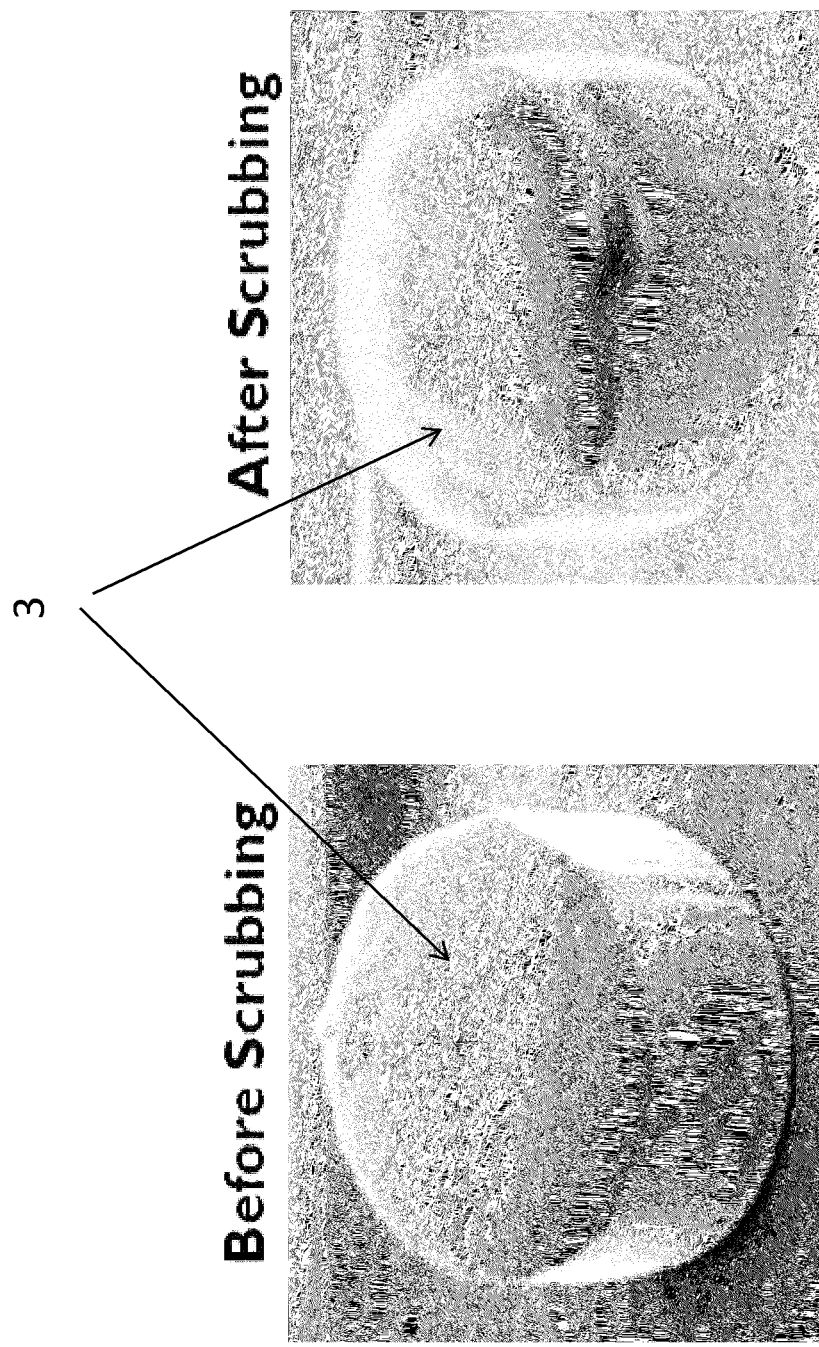
FIG. 4 presents a comparison between the Cu micro-bump surface before and after mechanical scrubbing.

Once the first and second semiconductor substrates 1 and 2 have been correctly positioned and the Cu micro-bumps are aligned, a mechanical scrubbing step is performed, as shown in FIG. 2B. The mechanical scrubbing step is used to further planarize the Cu micro-bump 3 surfaces and for removing the oxides and contaminants that have been or might have been build up on the metal surfaces. According to one embodiment the mechanical scrubbing can be performed following the process steps shown in FIG. 3A-3C. The mechanical scrubbing starts by lowering the suspended second semiconductor substrate 2, until the Cu micro-bump 3 surfaces are in physical contact as shown in FIG. 3B. While in physical contact, the surfaces of the Cu micro-bumps 3 are scrubbed against each other by controlling the X and Y plane movement of the first and second semiconductor substrates 1 and 2, as shown in FIG. 3B. During mechanical scrubbing a circular movement is created having an X and Y direction. As a result of the circular movement a soft friction action is generated on the surface of the Cu micro-bumps 3, thereby polishing and planarizing said surfaces. In order to prevent stress related failures and prevent heat to be generated due to friction during mechanical scrubbing, the scrubbing action is performed at very slow speed. The displacement of the Cu micro-bumps in the X and Y plane direction ranges from a few nanometers to around a few micrometers, more preferably the displacement in either X or Y direction is around 1 um. The mechanical scrubbing step is performed for duration between 1 second and a few minutes, more preferably the mechanical scrubbing is performed for around 40 seconds. As shown in FIG. 3C a low pressure scrubbing force of around 3.5 MPa and 14 MPa can be applied during mechanical scrubbing. The combination of a low pressure scrubbing force with mechanical scrubbing is highly beneficial for the purpose of removing a substantial layer of oxide and/or contaminants from Cu micro-bump 3 surfaces and for reducing the mechanical scrubbing time duration (period). The results of the mechanical scrubbing step on the Cu micro-bump 3 surface are shown in FIG. 4. It can be seen that Cu micro-bump 3 planarization and surface roughness is improved compared to the Cu micro-bump 3 surface prior to the mechanical scrubbing.

Following the planarization and cleaning of the Cu micro-bump 3 surfaces via mechanical scrubbing, the Thermo-compression bonding of the first and second semiconductor substrates 1 and 2 is performed, as shown in FIG. 2C, resulting in a semiconductor substrate stack 7. In this step the first and second semiconductor substrates 1 and 2 are subjected to pressure and heating simultaneously. The use of mechanical scrubbing prior to TC-bonding has as a result that the temperature and the pressure force required to achieve an effective bond between the metal contact structures of the first and second semiconductor substrates 1 and 2 is significantly reduced. The step of TC-bonding in accordance with certain embodiments can be performed at a temperature between 150° C. and 300° C., a pressure force between 10 MPa and 300 MPa and for duration between 1 second and 5 minutes, and more preferably for around 40 seconds.

In addition to providing an effective bond between the first and second semiconductor substrates 1 and 2, TC-bonding is also used for curing the "underfill" material 5, if it has been optionally used. The selection of the 'underfill" material 5 is closely related to the TC-bonding conditions. Therefore, for high temperature and high pressure TC-bonding a suitable "underfill" material 5 needs to be selected. However, high temperature curing "underfill" materials may exhibit additional thermal budget and stress due to the Coefficient of Thermal Expansion (CTE) mismatch of the underfill material used during bonding. The CTE mismatch may cause reliability concerns for certain application, such as bonding of memory integrated devices. By reducing the temperature and pressure required during TC-bonding "underfill" material 5 with lower curing temperature can be selected, thereby minimizing the thermal budget and stress related failures.

Figure 5:
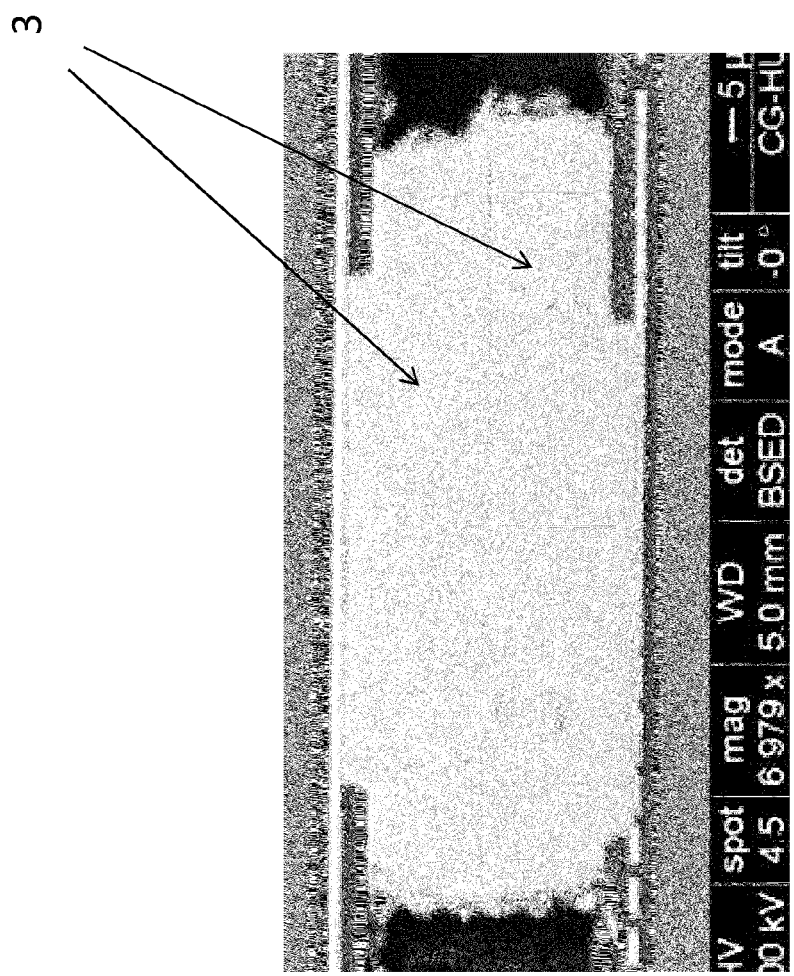
FIG. 5 shows the resulting Cu micro-bump after Thermo-compression bonding step.

After TC-bonding the surfaces of the Cu micro-bumps 3 in the resulting semiconductor substrate stack 7 are physically connected and have an electrical yield, as shown in FIG. 5. However, interface diffusion between the Cu micro-bumps 3 has not been achieved due of the low temperatures applied during TC-bonding.

According to one embodiment the interface diffusion of the Cu micro-bumps is achieved by performing a post-bonding thermal annealing step, as shown in FIG. 2D. During this step the semiconductor stack 7 is placed in an oven 6 for a predetermined time duration. For example, for Cu micro-bumps interface diffusion can be achieved at a temperature between 150° C. to 300° C. for a duration between 30 minutes to around 60 minutes.

Figure 6:
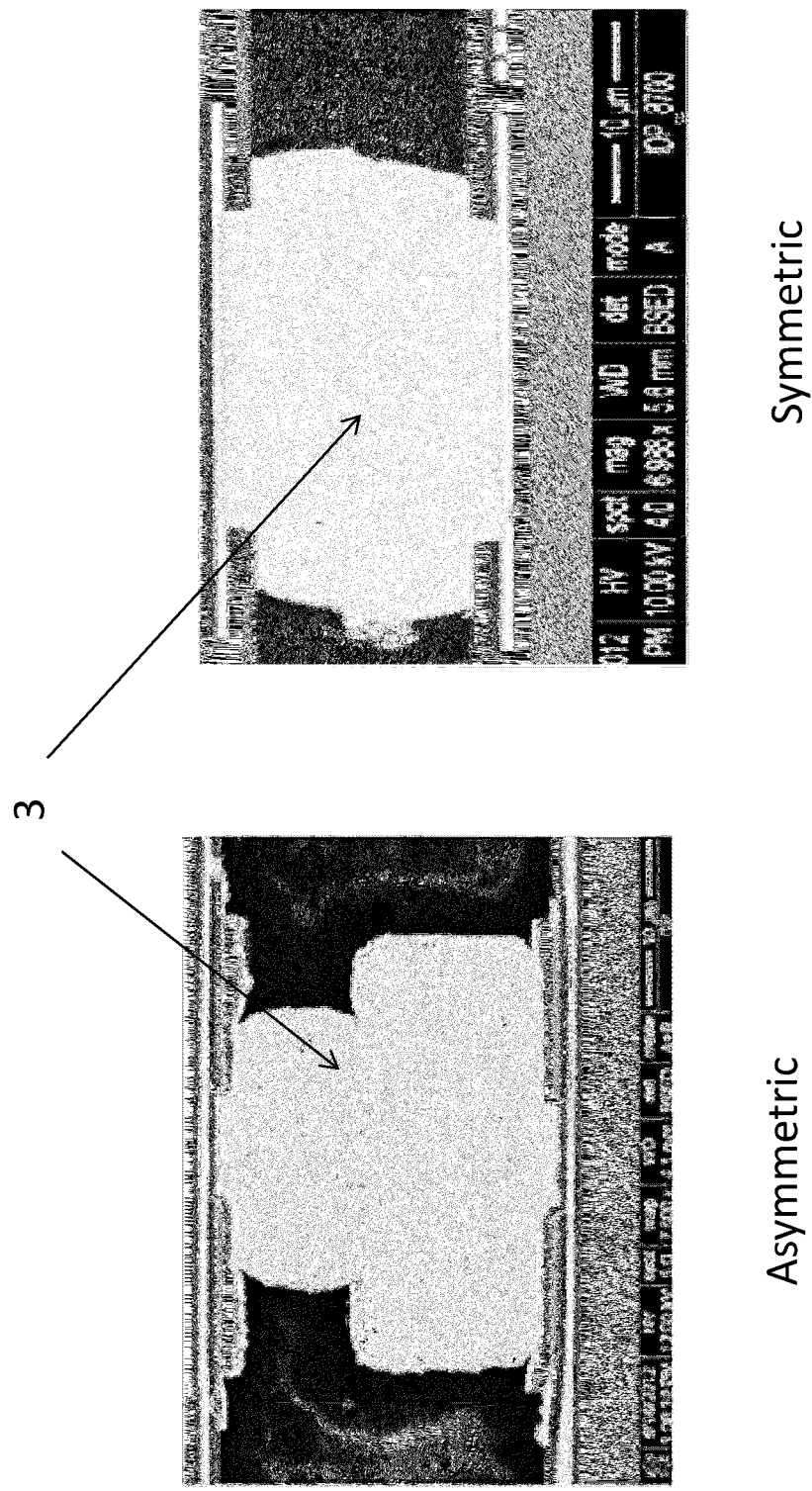
FIG. 6 shows the resulting Cu micro-bump bond after the post-bonding thermal annealing step.

FIG. 6 shows two configurations of Cu micro-bumps 3 after the post-bonding thermal annealing step has been performed. In the first configuration, Cu-micro-bumps 3 with different dimensions are bonded (asymmetric), while in the second configuration the Cu micro-bumps 3 have substantially equal dimensions (symmetric). In the case of bonding Cu micro-bumps with asymmetric dimensions one of the Cu micro-bumps 3 to be bonded has a smaller surface area compared to the other one. This configuration could be beneficial in the case of misalignment between the first and the second semiconductor substrates 1 and 2. For both configurations an effective bonding between the Cu micro-bumps 3 is observed. Therefore, the method of mechanical scrubbing for proving a low TC-bonding between a first and a second semiconductor substrate 1 and 2 can be successfully applied in both cases.

Figure 7C:
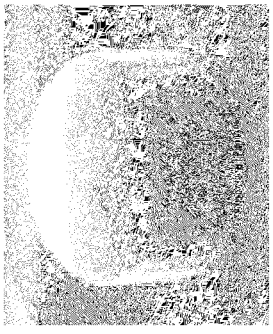
FIGS. 7A-7G present experimental results for determining the optimum mechanical scrubbing conditions
Figure 7B:
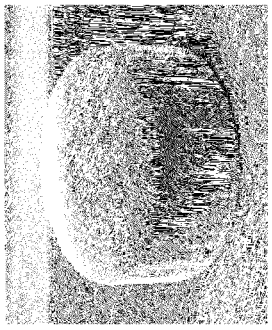
Figure 7A:
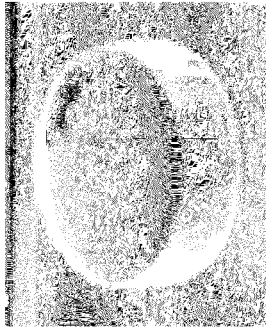
Figure 7F:
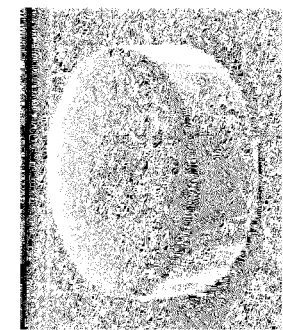
Figure 7E:
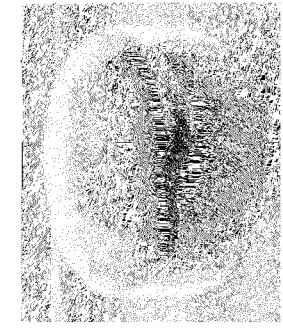
Figure 7D:
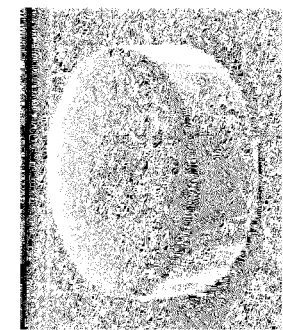
Figure 7G:
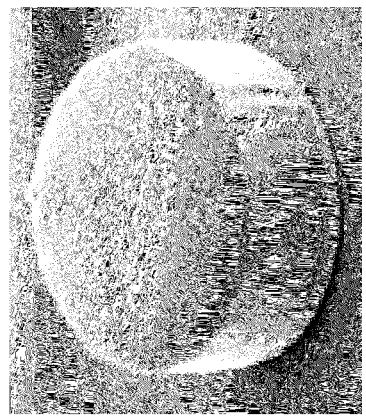

A number of experiments were carried out to determine the optimum mechanical scrubbing conditions that offer the best results and contribute to the relaxation of TC-bonding requirements. The main parameters that were altered were: a) the initial distance (z) between the Cu micro-bumps 3 while the semiconductor substrate 2 is suspended in the step shown in FIG. 2A, b) the pressure applied during the mechanical scrubbing, and c) the duration for which the mechanical scrubbing was performed. For Cu micro-bumps 3 the best results were obtained by setting the z distance at 2 um, the pressure force at 3.5 MPa and the duration at 10 sec. An overview of the experiments performed and the results obtained described in the table below and shown in FIGS. 7A-7F (reference standard shown in FIG. 7G).

| Experiment | Z (um) | Time Duration (sec) | Pressure Force (MPa) |
| --- | --- | --- | --- |
| A | 1 | 5 | 7 |
| B | 1 | 20 | 7 |
| C | 2 | 20 | 7 |
| D | 2 | 10 | 3.5 |
| E | 2 | 10 | 7 |
| F | 2 | 10 | 14 |

Figure 8:
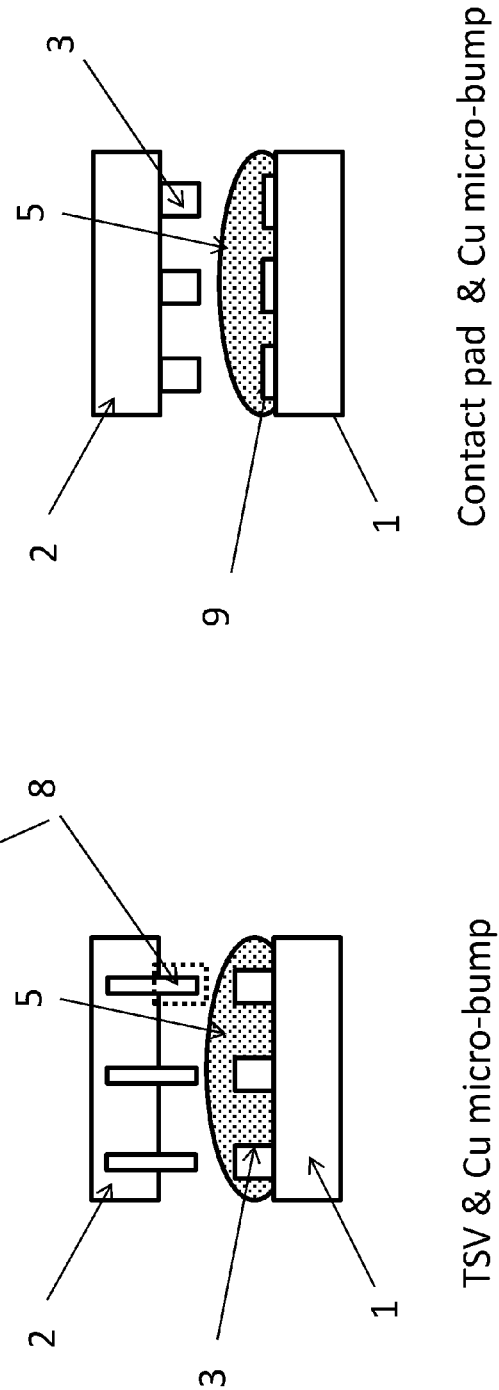
FIG. 8 shows alternative embodiments for bonding semiconductor substrates with heterogeneous contact structure.

FIG. 8 describes two alternative configurations of bonding a first and a second semiconductor substrate 1 and 2 having different types of metal contact structures. In the first alternative embodiment a TSV to Cu micro-bump bonding is shown. Here the second semiconductor substrate 2 is provided with exposed Through Silicon Via (TSV) nails 8, extending through the main surface while the first semiconductor substrate 1 is provided with Cu micro-bumps 3. In the second alternative embodiment a Cu micro-bump to Contact pad is shown, whereby the second semiconductor substrate 2 is provided with contact pads 9 that do not extend from the main surface.

In principal, the method for bonding semiconductor substrates at low temperature in accordance with certain embodiments can be performed on semiconductor substrates, whereby the metal contact structures formed on at least one of the semiconductor substrates protrudes from its main surface on which these contact structures are present.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities, conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method for thermo-compressing bonding a first substrate to a second substrate, the method comprising:
    providing a first semiconductor substrate and a second semiconductor substrate, wherein the first semiconductor substrate and the second semiconductor substrate each comprise at least one metal contact structure on a surface thereof;
    planarizing surfaces of the at least one metal contact structures;
    positioning the second semiconductor substrate in a proximity of the first semiconductor substrate, thereby aligning the at least one metal contact structure of the first semiconductor substrate with the at least one metal contact structure of the second semiconductor substrate, and bringing in contact the at least one metal contact structure of the first semiconductor substrate with the at least one metal contact structure of the second semiconductor substrate;
    mechanically scrubbing the surface of the at least one metal contact structure of the first semiconductor substrate against the surface of the at least one metal contact structure of the second semiconductor substrate, thereby cleaning the surfaces;
    bonding the first semiconductor substrate to the second semiconductor substrate using a thermal compression bonding, thereby forming a semiconductor substrate stack; and
    thermally annealing the semiconductor substrate stack, thereby creating an interface diffusion between the at least one metal contact structure of the first semiconductor substrate and the at least one metal contact structure of the second semiconductor substrate.

2. The method according to claim 1, wherein a metal contact structure of at least one of the first semiconductor substrate or the second semiconductor substrate protrudes from a main surface of the at least one of the first semiconductor substrate or the second semiconductor substrate.

3. The device of claim 1, wherein a metal contact structure of at least one of the first semiconductor substrate or the second semiconductor substrate comprises Cu.

4. The method according to claim 1, wherein a pressure is applied during the mechanically scrubbing.

5. The method according to claim 4, wherein the pressure applied is below 14 MPa.

6. The method according to claim 5, wherein the mechanically scrubbing is performed for a time duration below 40 seconds.

7. The method according to claim 1, wherein an underfill material is deposited on the surface of the first semiconductor substrate prior to the bonding.

8. The method according to claim 1, wherein dimensions of the at least one first contact structure and dimensions of the at least one second contact structure are substantially identical.

9. The method according to claim 1, wherein dimensions of the at least one first contact structure and dimensions of at least one second contact structure are substantially different.

10. The method according to claim 1, wherein a temperature applied during the thermal compression bonding is below 300° C.

11. The method according to claim 1, wherein a pressure applied during the thermal compression bonding is below 40 MPa.

12. The method according to claim 1, wherein planarizing surfaces of the at least one metal contact structures is performed by chemical-mechanical-polishing or fly cutting.

* * * * *

UNITED STATES PATENT AND TRADEMARK OFFICE
CERTIFICATE OF CORRECTION

PATENT NO. : 8,912,044 B2  
APPLICATION NO. : 14/094431  
DATED : December 16, 2014  
INVENTOR(S) : Yu-Hsiang Hu Page 1 of 1

It is certified that error appears in the above-identified patent and that said Letters Patent is hereby corrected as shown below:

Title page (item 57, Abstract) at line 10, Change "substrates" to --substrates.--.

In the Specification

In column 2 at line 48, Change "1 um" to --1 um.--.

In column 3 at line 57, Change "'underfill'"" to --"underfill"--.

In column 4 at line 44, Change "conditions" to --conditions.--.

In column 5 at line 58, Change "bonding" to --bonding.--.

In column 6 at line 31, Change "'underfill'"" to --"underfill"--.

In column 7 at line 36, Change "'underfill'"" to --"underfill"--.

In the Claims

In column 11 at line 9 (approx.), In Claim 3, change "device" to --method--.

Signed and Sealed this  
Twenty-fifth Day of August, 2015

Michelle K. Lee  
*Director of the United States Patent and Trademark Office*